(12) United States Patent
Horisaki et al.

(10) Patent No.: US 9,164,831 B2
(45) Date of Patent: Oct. 20, 2015

(54) MEMORY CONTROLLER, SEMICONDUCTOR STORAGE DEVICE, AND DECODING METHOD

(75) Inventors: Koji Horisaki, Yokohama (JP);
Toshikatsu Hida, Yokohama (JP);
Shinichi Kanno, Tokyo (JP); Osamu Torii, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 95 days.

(21) Appl. No.: 14/234,856

(22) PCT Filed: Mar. 14, 2012

(86) PCT No.: PCT/JP2012/057246
§ 371 (c)(1),
(2), (4) Date: Feb. 6, 2014

(87) PCT Pub. No.: WO2013/014974
PCT Pub. Date: Jan. 31, 2013

(65) Prior Publication Data
US 2014/0173377 A1 Jun. 19, 2014

(30) Foreign Application Priority Data
Jul. 26, 2011 (JP) .................. 2011-163475

(51) Int. Cl.
*H03M 13/00* (2006.01)
*G06F 11/10* (2006.01)
*H03M 13/15* (2006.01)

(52) U.S. Cl.
CPC ........ *G06F 11/1044* (2013.01); *G06F 11/1048* (2013.01); *H03M 13/1575* (2013.01)

(58) Field of Classification Search
CPC ........... G06F 11/1044; G06F 11/1048; H03M 13/1575
See application file for complete search history.

(56) References Cited

U.S. PATENT DOCUMENTS

| | | | | |
|---|---|---|---|---|
| 5,428,630 A | * | 6/1995 | Weng et al. | 714/763 |
| 6,147,827 A | * | 11/2000 | Southerland et al. | 360/53 |
| 6,256,762 B1 | | 7/2001 | Beppu | |
| 7,739,576 B2 | * | 6/2010 | Radke | 714/758 |

(Continued)

FOREIGN PATENT DOCUMENTS

| | | |
|---|---|---|
| JP | 63 275225 | 11/1988 |
| JP | 10 207726 | 8/1998 |

(Continued)

OTHER PUBLICATIONS

International Search Report Issued Jun. 19, 2012 in PCT/JP12/057246 Filed Mar. 14, 2012.

(Continued)

*Primary Examiner* — Esaw Abraham
(74) *Attorney, Agent, or Firm* — Oblon, McClelland, Maier & Neustadt, L.L.P.

(57) ABSTRACT

According to an embodiment, a memory interface that includes n number of channels and writes data subjected to an error correction encoding process having capable of correcting t symbols, n number of first error correction decoding units that perform an error correction decoding process of correcting s (s<t) symbols on read data, and a second error correction decoding units that perform an error correction decoding process of correcting t symbols on read data from which an error is detected after the error correction decoding process of correcting s symbols.

19 Claims, 5 Drawing Sheets

(56) References Cited

U.S. PATENT DOCUMENTS

| | | | |
|---|---|---|---|
| 7,836,364 B1 * | 11/2010 | Sutardja et al. | 714/723 |
| 7,900,117 B2 | 3/2011 | Kanno | |
| 7,904,790 B2 * | 3/2011 | Lee et al. | 714/763 |
| 8,032,812 B1 | 10/2011 | Yang et al. | |
| 8,091,010 B2 * | 1/2012 | Yim | 714/773 |
| 8,112,689 B2 * | 2/2012 | Hong et al. | 714/755 |
| 8,418,042 B2 | 4/2013 | Kanno | |
| 2004/0187052 A1 | 9/2004 | Shiota et al. | |
| 2010/0223529 A1 | 9/2010 | Kaburaki et al. | |
| 2011/0107188 A1 | 5/2011 | Dror et al. | |
| 2011/0231738 A1 | 9/2011 | Horisaki | |
| 2011/0239081 A1 | 9/2011 | Hida et al. | |
| 2013/0179750 A1 | 7/2013 | Hida et al. | |
| 2013/0191705 A1 | 7/2013 | Watanabe et al. | |

FOREIGN PATENT DOCUMENTS

| | | |
|---|---|---|
| JP | 2004 280556 | 10/2004 |
| JP | 2007 013260 | 1/2007 |
| JP | 2008 016092 | 1/2008 |
| JP | 2009 059422 | 3/2009 |

OTHER PUBLICATIONS

Written Opinion of the International Searching Authority Issued Jun. 19, 2012 in PCT/JP12/057246 Filed Mar. 14, 2012.

* cited by examiner

MEMORY CONTROLLER, SEMICONDUCTOR STORAGE DEVICE, AND DECODING METHOD

CROSS-REFERENCE TO RELATED APPLICATIONS

This application is based upon and claims the benefit of priority from Japanese Patent Application No. 2011-163475, filed on Jul. 26, 2011; the entire contents of which are incorporated herein by reference.

FIELD

Embodiments described herein relate generally to a memory controller, a semiconductor storage device, and a decoding method.

BACKGROUND

Typically, regarding codes having a high error correction capability (and high code rate), a decoding process thereof becomes complicated. Moreover, the number of errors to be generated varies, so that there is a demand to achieve both exertion of a high error correction capability in a case of a large number of errors and completion of correction with a simple decoding process in a case of a small number of errors. In response to this demand, there are known a technology of performing a multiple error correction encoding and a technology of adaptively switching a decoding method.

In the technology of performing a multiple error correction encoding and the technology of adaptively switching a decoding method, typically, there are problems such as that a process becomes complicated or a circuit scale increases.

DETAILED DESCRIPTION

According to an embodiment, a memory controller, which controls a memory unit, includes an encoding unit that generates an error detection code based on data to be written to the memory unit and generates an error correction code capable of correcting t (t is an integer of 2 or more) symbols with respect to the data and the error detection code. Moreover, this memory controller includes a memory interface that writes the data, the error detection code, and the error correction code to the memory unit for each of n (n is an integer of 2 or more) number of channels, and reads out the data, the error detection code, and the error correction code from the memory unit as read data for each of the channels. Furthermore, this memory controller includes n number of first error correction decoding units that each perform a first error correction decoding process capable of correcting s (s is an integer equal to or greater than 1 and smaller than t) symbols on the read data for each of the channels, n number of error detecting units that perform an error detecting process for each of the channels based on data decoded by the first error correction decoding process and an error detection code, and a second error correction decoding unit, number of which is smaller than n and which performs a second error correction decoding process capable of correcting t symbols on the read data for the channel from which an error is detected by the error detecting unit.

A memory controller, a semiconductor storage device, and a decoding method according to the embodiment will be explained below in detail with reference to the accompanying drawings. The present invention is not limited to this embodiment.

Figure 1:
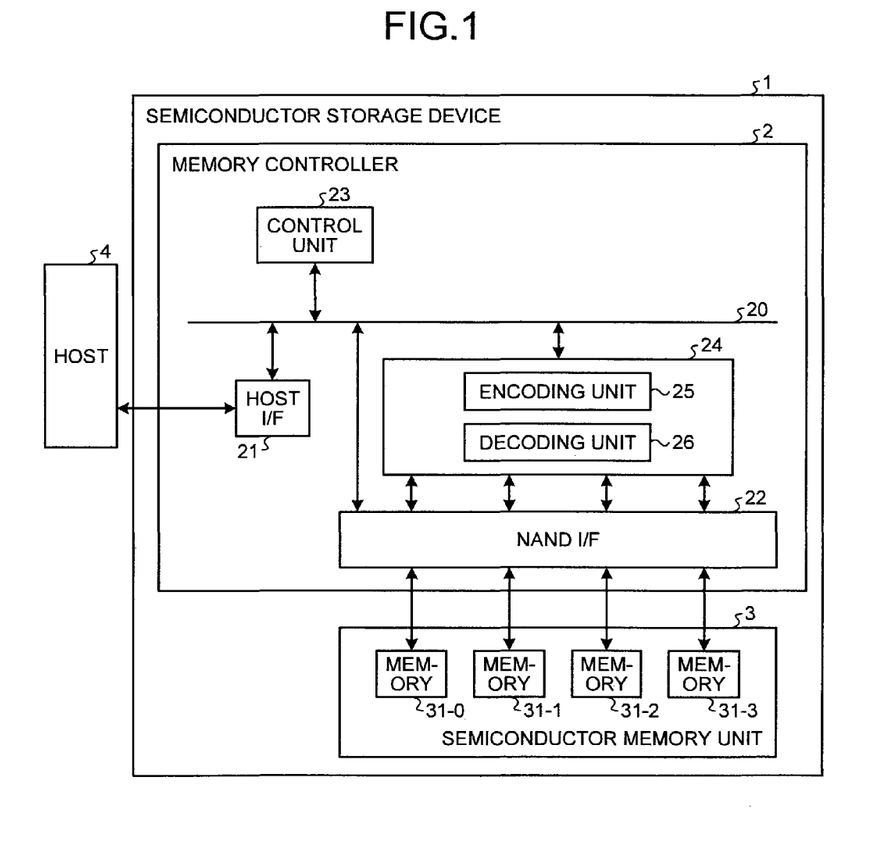
FIG. 1 is a block diagram illustrating a configuration example of a semiconductor storage device.

FIG. 1 is a block diagram illustrating a configuration example of a semiconductor storage device 1 according to the embodiment. The semiconductor storage device 1 according to the present embodiment includes a memory controller (memory control device) 2, and a semiconductor memory unit (memory unit) 3 including a NAND-type memory cell. The semiconductor storage device 1 is connected to a host 4 via a communication medium and functions as an external storage medium for the host 4. Examples of the host 4 include a personal computer and a CPU (Central Processing Unit) core.

The memory controller 2 includes an internal bus 20, a Host I/F (Interface) 21, a NAND I/F (memory interface) 22, a control unit 23, and an encoding/decoding processing unit 24. The encoding/decoding processing unit 24 includes an encoding unit 25 and a decoding unit 26.

The Host I/F 21 outputs a command, data, and the like received from the host 4 to the internal bus 20. The Host I/F 21 transmits data input via the internal bus 20, a response notification (such as notification indicating a command execution completion) from the control unit 23, and the like to the host 4.

The semiconductor memory unit 3 includes memories 31-0 to 31-3. Each of the memories 31-0 to 31-3 includes one or more memory chips.

The NAND I/F 22 includes four channels (channels ch0 to ch3) so that writing and reading can be performed to and from the memories 31-0 to 31-3 in parallel. The channels ch0 to ch3 control the corresponding memories 31-0 to 31-3, respectively. In this embodiment, the number of channels is four and the number of memories configuring the semiconductor memory unit 3 is four, however, the number of channels is not limited to this and it is sufficient that the semiconductor memory unit 3 includes memories corresponding to the number of channels.

The control unit 23 is a control unit that overall controls each component of the semiconductor storage device 1 and includes a CPU core, a RAM (Random Access Memory), a ROM (Read Only Memory), a DMA (Direct Memory Access) controller, and the like. When the control unit 23 receives a command from the host 4 via the Host I/F 21 and the internal bus 20, the control unit 23 performs control according to the command. For example, the control unit 23 instructs the NAND I/F 22 to perform writing of data to the semiconductor memory unit 3, reading of data from the semiconductor memory unit 3, and the like according to a command from the host 4. The control unit 23 instructs the encoding/decoding processing unit 24 to perform an error correction encoding process or a decoding process.

The encoding/decoding processing unit 24 performs an error correction encoding process on data received from the host 4 based on an instruction of the control unit 23 and outputs data to the NAND I/F 22, or performs a decoding process on data input from the NAND I/F 22. At this time, the control unit 23 controls to divide data for each channel and input them to the encoding/decoding processing unit 24, and the encoding/decoding processing unit 24 performs an error correction encoding process in parallel for each channel and outputs the process result to the corresponding channels of the NAND I/F 22. When data read out from the semiconductor memory unit 3 is input from the NAND I/F 22, the encoding/decoding processing unit 24 performs a decoding process on data input from each channel of the NAND I/F 22 in parallel for each channel.

The configuration of the semiconductor storage device 1 shown in FIG. 1 is an example, and any configuration can be applied without being limited to the configuration shown in FIG. 1 so long as the configuration is such that a semiconductor memory and a controller controlling reading and writing of the semiconductor memory are included, communication can be established with the host 4, and an encoding/decoding process is performed for each channel. Moreover, a storage unit other than a semiconductor memory may be used instead of the semiconductor memory unit 3.

Next, a write operation to the semiconductor memory unit 3 in the present embodiment is explained. First, when writing of data is instructed from the host 4, the control unit 23 sorts data for each channel, and instructs the encoding/decoding processing unit 24 to perform encoding and instructs the NAND I/F 22 to perform writing to the semiconductor memory unit 3. Write target data to be transmitted from the host 4 is written to a not-shown buffer memory in the semiconductor storage device 1 for each channel.

Figure 2:
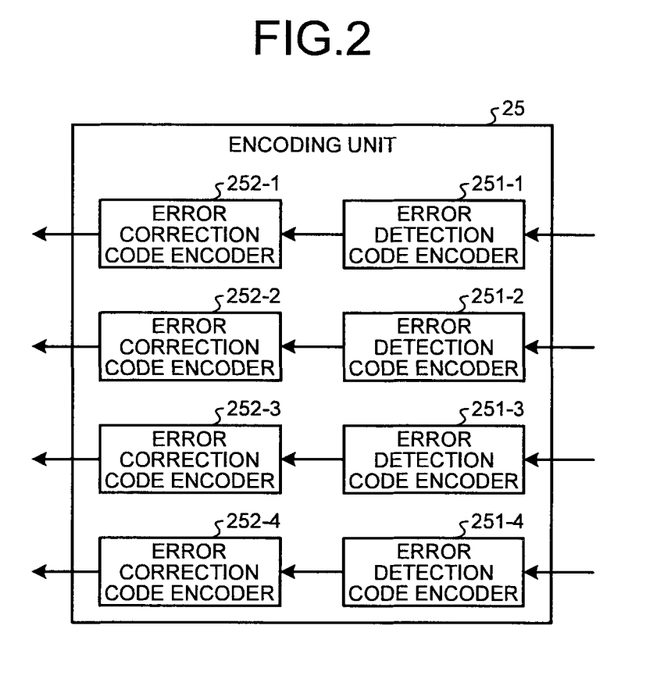
FIG. 2 is a diagram illustrating a configuration example of an encoding unit.

In the present embodiment, the encoding unit 25 generates an error detection code and an error correction code as an encoding process. FIG. 2 is a diagram illustrating a configuration example of the encoding unit 25 in the present embodiment. As shown in FIG. 2, the encoding unit 25 includes error detection code encoders 251-1 to 251-4 that generate a CRC (Cyclic Redundancy Check) code based on write data of a predetermined size and error correction code encoders 252-1 to 252-4 that generate an error correction code based on write data of a predetermined size and a CRC code corresponding to the data.

In this embodiment, an example in which the encoding unit 25 generates a CRC code as an error detection code is explained, however, an error detection code is not limited to a CRC code. Moreover, any code may be used as an error correction code, and, in this embodiment, a BCH code is used. An error correction code is not limited to a BCH code and any code, such as a RS (Reed-Solomon) code, may be used. In this embodiment, because the number of channels is four, the number of each of the error detection code encoders and the error correction code encoders is four, however, it is sufficient to provide the error detection code encoder and the error correction code encoder according to the number of channels.

The error detection code encoders 251-1 to 251-4 generate an error detection code with respect to write target data corresponding to each channel input from the buffer memory. The error correction code encoders 252-1 to 252-4 generate an error correction code capable of correcting t (t is an integer of 1 or more) symbols with respect to write target data and a corresponding error detection code and input the write target data, the error detection code, and the generated error correction code to a corresponding channel of the NAND I/F 22. In this embodiment, because a BCH code, which performs bit-by-bit correction, is used as an error correction code, an error correction code (hereinafter, referred to as t-symbol error correction code) capable of correcting t symbols indicates a BCH code capable of correcting t bits. On the other hand, a RS code or the like performs symbol-by-symbol correction, so that a correction unit depends on the type of an error correction code to be employed. This embodiment includes a case where 1 symbol is 1 bit, so that when it is described that t symbols can be corrected, this includes the meaning that t bits can be corrected in the case of bit-by-bit correction.

The NAND I/F 22 writes write target data, an error detection code, and an error correction code input from the error correction code encoders 252-1 to 252-4 to the memories 31-0 to 31-3, respectively, for each channel. Write target data may be input to the NAND I/F 22 from the buffer memory instead of from the encoding unit 25.

Figure 3:
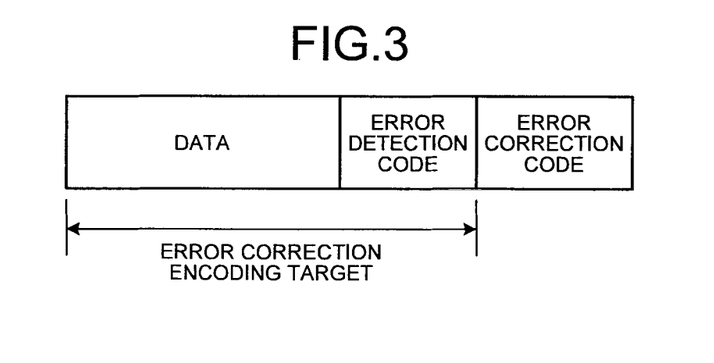
FIG. 3 is a diagram illustrating a concept of data and codes to be written to a semiconductor memory unit.

FIG. 3 is a diagram illustrating a concept of data and codes to be written to the semiconductor memory unit 3. As shown in FIG. 3, an error detection code (CRC code) is generated based on write data (described as data in FIG. 3) of a predetermined size and an error correction code is generated with the write data of the predetermined size and the corresponding error detection code as an error correction encoding target. The predetermined size is, for example, a sector size. The sector size is, for example, 512 bytes. FIG. 3 illustrates an example in which one error correction code is generated with respect to one pair of data and an error detection code, however, one error correction code may be generated with respect to a plurality of pairs of data and an error detection code.

Next, a read operation from the semiconductor memory unit 3 in the present embodiment is explained. When reading of data is instructed from the host 4, the control unit 23 instructs the encoding/decoding processing unit 24 to perform decoding and instructs the NAND I/F 22 to perform reading from the semiconductor memory unit 3. Each channel of the NAND I/F 22 reads out data and corresponding error detection code and error correction code from the semiconductor memory unit 3 based on the instruction from the control unit 23 and outputs the data and the corresponding error detection code and error correction code, which are read out, to the encoding/decoding processing unit 24.

The decoding unit 26 of the encoding/decoding processing unit 24 performs a decoding process based on the data, the error detection code, and the error correction code, which are read out, for each channel, and when determining that there is an error by a decoding process, performs error correction on the read data. The Host I/F 21 transmits data after error correction (when there is no error, data read out from the semiconductor memory unit 3) to the host 4.

Figure 4:
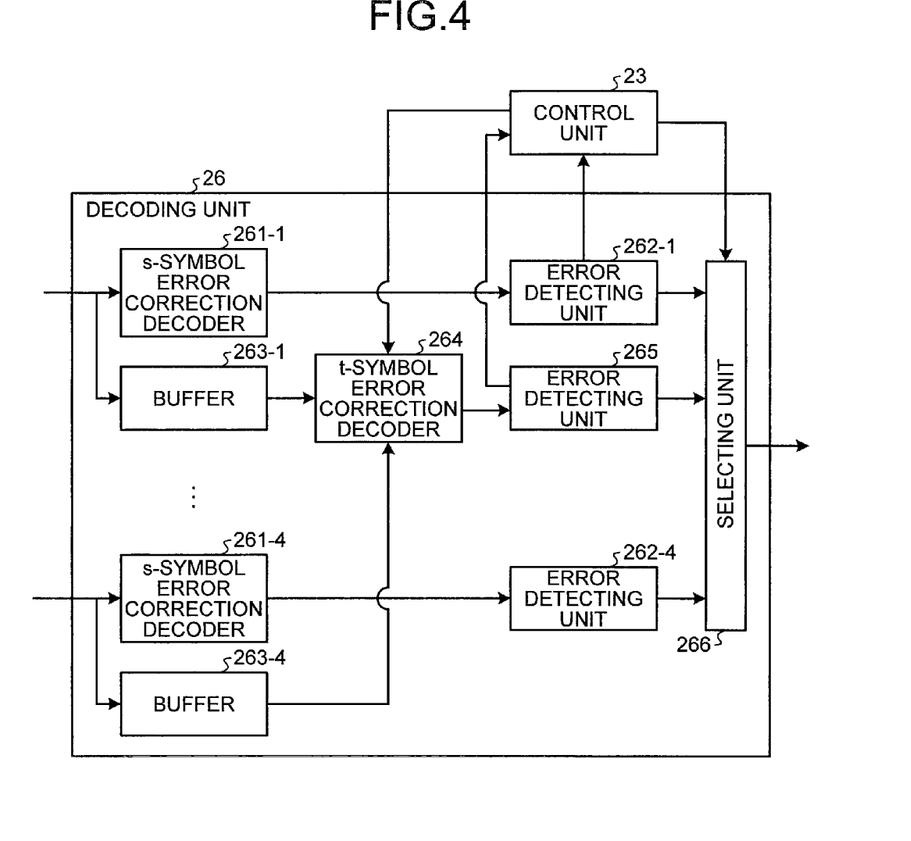
FIG. 4 is a diagram illustrating a configuration example of a decoding unit.

Next, a decoding process of the present embodiment is explained in detail. FIG. 4 is a diagram illustrating a configuration example of the decoding unit 26 in the present embodiment. As shown in FIG. 4, the decoding unit 26 in the present embodiment includes s-symbol error correction decoders (first error correction decoding units) 261-1 to 261-4 capable of performing an error correction process for s errors (s is an integer equal to or greater than 1 and smaller than t), error detecting units 262-1 to 262-4 that perform error detection by using an error detection code, and buffers 263-1 to 263-4 for respective channels. The decoding unit 26 further includes a t-symbol error correction decoder (second error correction decoding unit) 264 capable of performing an error correction process for t errors, an error detecting unit 265, and a selecting unit 266. In this embodiment, because the number of channels is four, the number of each of the s-symbol error correction decoders, the error detecting units, and the buffers is four, however, it is sufficient that these are provided according to the number of channels. Moreover, instead of providing the buffers 263-1 to 263-4 for the channels, respectively, one buffer may be shared, the buffer may be integrated with the s-symbol error correction decoders 261-1 to 261-4, or the buffer may be provided outside the decoding unit 26.

Figure 5:
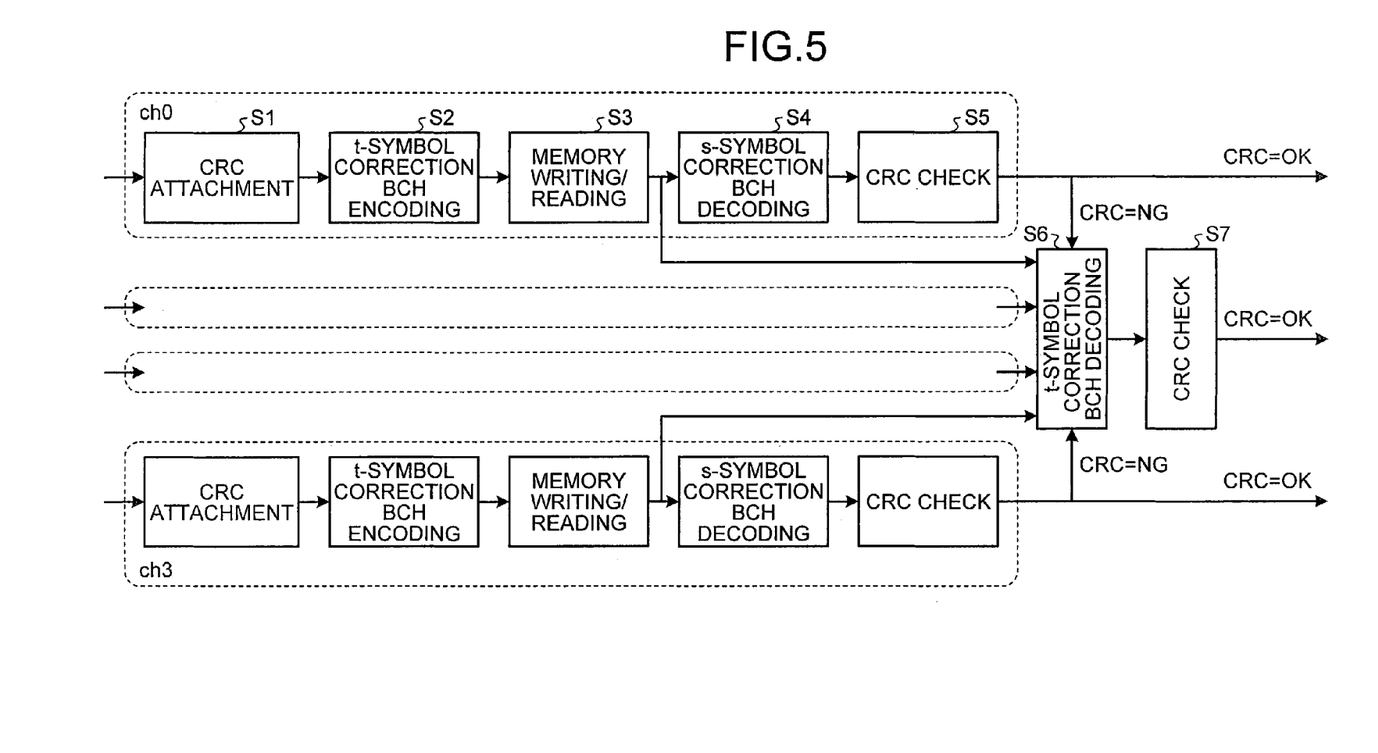
FIG. 5 is a diagram illustrating an outline of an encoding/decoding process.

FIG. 5 is a diagram illustrating an outline of an encoding/decoding process in the present embodiment. As shown in FIG. 5, in the present embodiment, a process of encoding and decoding is performed for each of the channels (ch0 to ch3) of the NAND I/F 22. FIG. 5 illustrates an example of using a CRC code as an error detection code and a BCH code as an error correction code. First, when writing, as described above, a CRC attaching process (generation of an error detection code) is performed in the encoding unit 25 for each channel (Step S1). In FIG. 5, a step number is attached only to processes in ch0 for simplifying the figure, however, similar processes are performed in other channels (ch1 to ch3).

Then, a t-symbol correction BCH encoding process (t-symbol error correction encoding process) is performed by the encoding unit 25 for each channel (Step S2), and writing of data and each code to the semiconductor memory unit 3 is performed, and, when there is a read request, reading from the semiconductor memory unit 3 is performed (Step S3). Data and each code read out from the semiconductor memory unit 3 are first subjected to a s-symbol correction BCH decoding (s-symbol error correction decoding process) by the decoding unit 26 for each channel (Step S4) and is subjected to a CRC check (error detection process) (Step S5).

When there is no error (CRC=OK) as a result of the CRC check, data subjected to the s-symbol correction BCH decoding is transmitted from the decoding unit 26 to the host 4. Data for a channel determined to have an error (CRC=Fail) as a result of the CRC check is subjected to a t-symbol correction BCH decoding (t-symbol error correction decoding process) (Step S6) and is subjected to the CRC check based on the t-symbol error correction decoding process (Step S7). The CRC check (error detection process) in Step S5 and the CRC check (error detection process) in Step S7 may be performed by independent circuits or may be performed by a common circuit. When there is no error as a result of this CRC check, data subjected to the t-symbol correction BCH decoding is transmitted to the host 4 from the decoding unit 26.

The difference between the s-symbol error correction process and the t-symbol error correction process is explained by using a specific example of an error correction process. As an example, a case where a code length=15, s=1, and t=2 is explained. In an encoding process, a BCH code capable of correcting t (=2) errors (capable of performing t-symbol correction) is generated.

In this case, when performing decoding by the t-symbol error correction process, first, two syndromes (a0, a1) are calculated based on data read out from the semiconductor memory unit 3. Next, coefficients (b0, b1) of two error location polynomials are obtained based on, for example, the following Equation (1) by using the syndromes (a0, a1). The following calculation method is one example and a calculation method of the error location polynomials depends on a decoding algorithm and therefore is not limited to the following method.

$$b0 = a0$$
$$b1 = (a0^3 + a1)/a0 \quad (1)$$

Thereafter, $X(x0, x1)$ satisfying $1 + b0 \times X + b1 \times X^2 = 0$ is obtained. $X(x0, x1)$ obtained here represents an error location and error correction can be performed by inverting the bit.

On the other hand, in the case of performing s (=1)-symbol correction, first, one syndrome a0 is calculated based on data read out from the semiconductor memory unit 3. Next, in the similar manner to the above, one coefficient b0 of the error location polynomial is obtained. Thereafter, $X(x0)$ satisfying $1 + b0 \times X = 0$ is obtained. $X(x0)$ obtained here represents an error location and error correction can be performed by inverting the bit.

As above, in the s-symbol correction decoding process, the calculation amount is less than the t-symbol correction decoding process and calculation of a coefficient and the like are typically performed in parallel, so that the s-symbol correction decoding process can be implemented in a decoding circuit having a smaller circuit area than the t-symbol correction decoding process.

As described above, in the present embodiment, in an encoding process, the t-symbol error correction code is generated. When performing decoding by using the t-symbol error correction code, normally, a decoding process is performed by using a decoder capable of performing an error correction process for t errors. However, in this case, when t becomes large, a hardware scale of the decoder becomes large. When selecting an error correction code, typically, an error correction code capable of addressing errors larger in number than an assumed average number of errors for reducing the possibility of disabling error correction. Therefore, the number of actually generated errors is smaller than t in most cases.

In the present embodiment, the s-symbol error correction decoders 261-1 to 261-4 addressing error correction for s errors, which is smaller than t, are provided for the channels, respectively, and usually, an error correction process is performed by the s-symbol error correction decoders 261-1 to 261-4. Then, the error detecting units 262-1 to 262-4 perform error detection based on data after the error correction process and an error detection code for each channel, and, when an error is detected as a result thereof, an error correction process by the t-symbol error correction decoder 264 is performed. The t-symbol error correction decoder 264 does not necessarily need to be provided for the number of channels and it is sufficient to provide one of more t-symbol error correction decoders 264.

In a decoding process, usually, it is sufficient to perform the s-symbol error correction process, so that a processing load in an error correction process is not large, thus enabling to reduce a hardware scale without complicating a process. In an error correction encoding, it is sufficient to generate one type of the t-symbol error correction code, so that error correction encoding does not need to be doubly performed on the same data and a redundant code is not increased. Furthermore, data (data read out from the semiconductor memory unit 3) input to the t-symbol error correction decoder 264 is the same as data input to any of the s-symbol error correction decoders 261-1 to 261-4, so that, for example, data does not need to be read out from the semiconductor memory unit 3 again.

Figure 6:
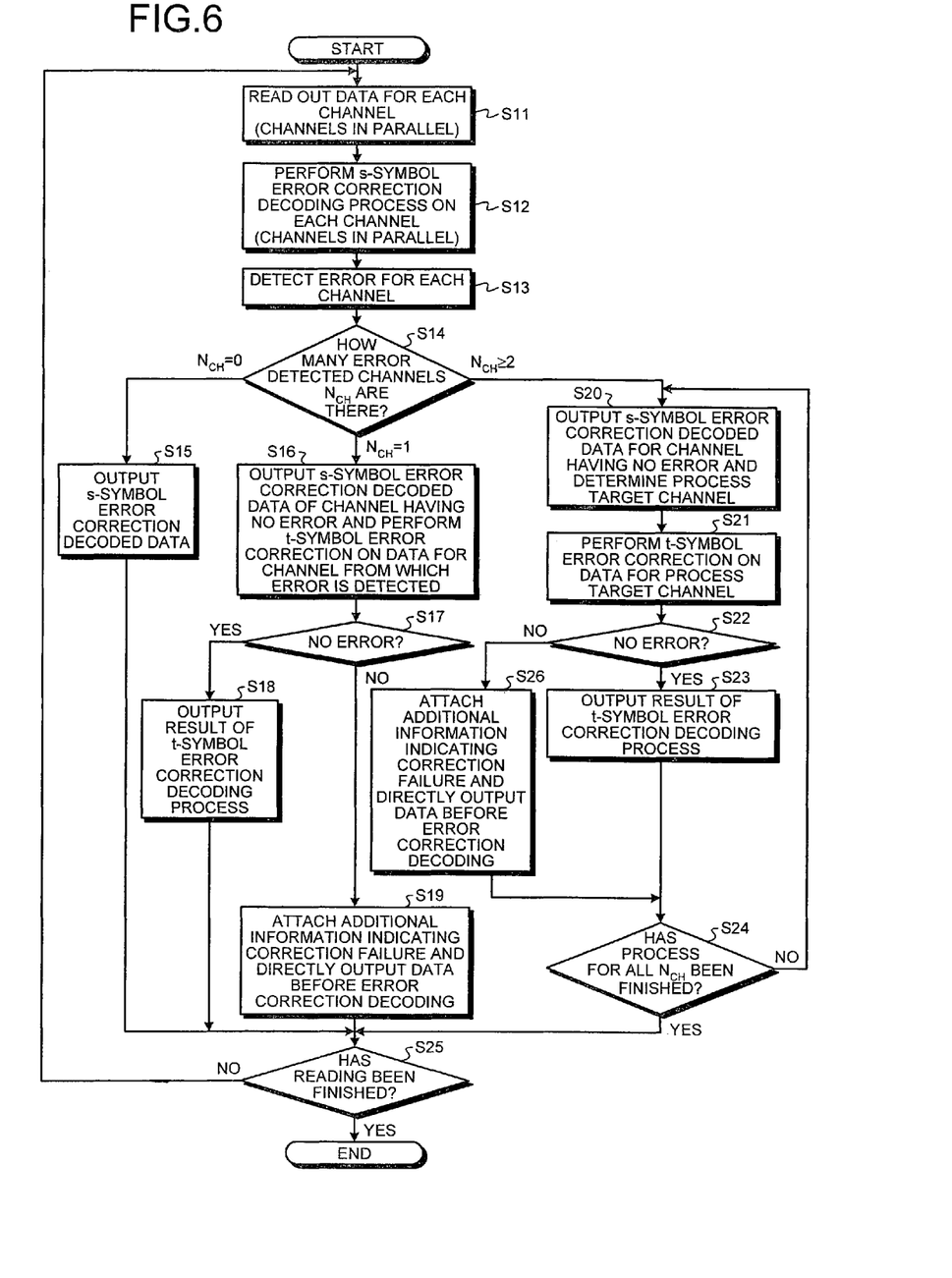
FIG. 6 is a flowchart illustrating one example of a decoding process procedure.

FIG. 6 is a flowchart illustrating one example of a decoding process procedure in the present embodiment. An operation of the decoding unit 26 in the present embodiment is explained with reference to FIG. 5 and FIG. 6. First, when a decoding process is started, data (data that is read out from the semiconductor memory unit 3 and includes an error correction code and an error detection code) is read out from each channel by the NAND I/F 22 and is input to each of the s-symbol error correction decoders 261-1 to 261-4 (Step S11). Moreover, data input from the channels of the NAND I/F 2 is also input to the buffers 263-1 to 263-4, respectively.

The s-symbol error correction decoders 261-1 to 261-4 perform the s-symbol error correction decoding process (error correction decoding process capable of correcting s errors) on data input from each channel of the NAND I/F 22 (Step S12).

The error detecting units 262-1 to 262-4 perform an error detection process based on data subjected to the s-symbol error correction process by the s-symbol error correction decoders 261-1 to 261-4 and an error detection code, and notify the control unit 23 of the error detection result and output data subjected to the s-symbol error correction decoding process to the selecting unit 266 (Step S13).

The control unit 23 obtains the number of channels $N_{CH}$, from which an error is detected, based on the error detection result notified from the error detecting units 262-1 to 262-4, and determines whether $N_{CH}$ is 0, 1, or 2 or more (Step S14). When $N_{CH}$ is 0 (Step S14 $N_{CH}$=0), the control unit 23 instructs the selecting unit 266 to select all data output from the error detecting units 262-1 to 262-4 and output them after attaching thereto additional information indicating an error correction decoding success, and the selecting unit 266 outputs the data output from the error detecting units 262-1 to 262-4 according to the instruction (Step S15). Then, the control unit 23 determines whether reading of read target data is finished (Step S25), and, when reading is finished (Yes in Step S25), finishes the process and, when reading is not finished (No in Step S25), returns to Step S11.

When $N_{CH}$ is 1 (Step S14 $N_{CH}$=1), the control unit 23 instructs the selecting unit 266 to select data (s-symbol error correction decoding data) output from the error detecting units 262-1 to 262-4 corresponding to channels, from which an error is not detected, and output it after attaching thereto additional information indicating an error correction decoding success, and the selecting unit 266 outputs the data according to the instruction (Step S16). In Step S16, moreover, the control unit 23 instructs the t-symbol error correction decoder 264 to read out data from the buffers 263-1 to 263-4 corresponding to the channel, from which an error is detected, and perform a process thereon, and the t-symbol error correction decoder 264 performs the t-symbol error correction process based on the instruction from the control unit 23 (Step S16). Specifically, the t-symbol error correction decoder 264 reads out data from the buffers 263-1 to 263-4 (buffer storing data from which an error is detected after the s-symbol error correction process), from which the t-symbol error correction decoder 264 is instructed to read out data, performs the t-symbol error correction process on the data, and outputs processed data to the error detecting unit 265.

The error detecting unit 265 performs error detection based on data after the t-symbol error correction process, and notifies the control unit 23 of the error detection result and outputs the data subjected to the t-symbol error correction process to the selecting unit 266. The control unit 23 determines whether there is an error based on the error detection result notified from the error detecting unit 265 (Step S17) and, when there is no error (Yes in Step S17), the control unit 23 instructs the selecting unit 266 to select data output from the error detecting unit 265 and output it after attaching thereto additional information indicating an error correction decoding success, and the selecting unit 266 outputs the data based on the instruction (Step S18), and the process proceeds to Step S25. On the other hand, when determining that there is an error in Step S17 (No in Step S17), the control unit 23 instructs the selecting unit 266 to select data in the buffers 263-1 to 263-4 corresponding to a channel, from which an error is detected, and output it after attaching thereto additional information indicating an error correction decoding failure, and the selecting unit 266 outputs the data based on the instruction (Step S19) and the process proceeds to Step S25.

In Step S14, when $N_{CH}$ is two or more (Step S14 $N_{CH}$≥2), the control unit 23 instructs the selecting unit 266 to select data output from the error detecting units 262-1 to 262-4 corresponding to a channel, from which an error is not detected, and output it after attaching thereto additional information indicating an error correction decoding success, and the selecting unit 266 outputs the data according to the instruction (Step S20). In Step S20, moreover, the control unit 23 determines a channel to be a target for the t-symbol error correction process among the $N_{CH}$ channels (Step S20). Then, the control unit 23 instructs the t-symbol error correction decoder 264 to read out data from the buffers 263-1 to 263-4 corresponding to the determined channel and perform a process thereon, and the t-symbol error correction decoder 264 performs the t-symbol error correction process based on the instruction from the control unit 23 (Step S21). The error detecting unit 265 performs error detection based on data after the t-symbol error correction process, and notifies the control unit 23 of the error detection result and outputs the data subjected to the t-symbol error correction process to the selecting unit 266. The control unit 23 determines whether there is an error based on the error detection result notified from the error detecting unit 265 (Step S22) and, when there is no error (Yes in Step S22), the control unit 23 instructs the selecting unit 266 to select data output from the error detecting unit 265 and output it after attaching thereto additional information indicating an error correction decoding success, and the selecting unit 266 outputs the data based on the instruction (Step S23).

The control unit 23 determines whether the t-symbol error correction process is performed on all of the $N_{CH}$ channels (Step S24) and, when the t-symbol error correction process is finished with respect to all of the $N_{CH}$ channels (Yes in Step S24), proceeds to Step S25. When there is a channel that has not been subjected to the t-symbol error correction process among the $N_{CH}$ channels (No in Step S24), the process returns to Step S20. In Step S20 from the second time, a channel to be a target for the t-symbol error correction process is determined from among channels that have not been subjected to the t-symbol error correction process.

In Step S22, when there is an error (No in Step S22), the control unit 23 instructs the selecting unit 266 to select data in the buffers 263-1 to 263-4 corresponding to a channel, from which an error is detected, and output it after attaching thereto additional information indicating an error correction decoding failure, and the selecting unit 266 outputs the data based on the instruction (Step S26), and the process proceeds to Step S24.

A decoding method by the s-symbol error correction decoders 261-1 to 261-4 and the t-symbol error correction decoder 264 is not restricted, however, when a BCH code, a RS code, or the like is used, the s-symbol error correction decoders 261-1 to 261-4 and the t-symbol error correction decoder 264 perform a decoding operation (i.e., decoding operation with the same code length) on the same GF (Galois field).

In this embodiment, a correction capability (value of t) of the error correction code encoders 252-1 to 252-4 and the t-symbol error correction decoder 264 is explained as a fixed value, however, it can be set based on a control signal from the host.

For example, in a case of using a BCH code, a primitive polynomial used in encoding is predetermined and an encoding process is performed by using a generator polynomial generated by using this primitive polynomial in encoding. A generator polynomial G (x) of a t-symbol correction BCH code can be represented by the following Equation (2).

$$G(x) = M_1(x) \cdot M_3(x) \cdot M_5(x) \ldots M_{(2t-1)}(x) \quad (2)$$

$M_1(x)$ is a polynomial in which a primitive element α is a root and is called a primitive polynomial. $M_3(x)$ is a polynomial in which $\alpha^3$ is a root, $M_5(x)$ is a polynomial in which $\alpha^5$ is a root, ..., and $M_{(2t-1)}(x)$ is a polynomial in which $\alpha^{(2t-1)}$ is a root. When $M_1(x)$ is determined, $M_3(x)$, $M_5(x)$, ..., $M_{(2t-1)}(x)$ can be sequentially obtained by calculation. Accordingly, a generator polynomial can be obtained if a primitive polynomial and a correction capability (value of t) are known.

In a decoding process, in the similar manner, a decoding process corresponding to encoding can be performed by specifying a generator polynomial based on a primitive polynomial and a correction capability (value of t).

The error correction code encoder and the error correction decoder, in which a correction capability is variable, may become large in circuit scale compared with a case where a correction capability is a fixed value, however, because the circuit scale of the error correction code encoder is smaller than the circuit scale of the error correction decoder, even if the circuit scale of the error correction code encoder increases, increase in circuit scale as a whole memory controller is relatively small. Moreover, the memory controller according to the present invention has characteristics in which the t-symbol error correction decoder 264 is provided fewer in number than the channels, so that increase in circuit scale is small as a whole memory controller compared with a case where a correction capability of all error correction decoders is made variable.

In the above explanation, an example of including one t-symbol error correction decoder 264 is explained, however, two or more t-symbol error correction decoders 264 may be included. When an error is detected after performing the s-symbol error correction process in two or more channels at the same time, in the case of including one t-symbol error correction decoder 264, the t-symbol error correction decoding process for any one of the channels cannot be started until the t-symbol error correction decoding process for the other one of the channels is finished, however, in the case of including two t-symbol error correction decoders 264, it is possible to perform the t-symbol error correction decoding process for two channels at the same time. However, increase in the number of the t-symbol error correction decoders 264 leads to increase in hardware scale, so that the t-symbol error correction decoder 264 can be appropriately selected in consideration of an amount of increase in hardware scale, a required rate with respect to the assumed number of errors and reading, and the like.

As above, in the present embodiment, the s-symbol error correction decoding process by the s-symbol error correction decoders 261-1 to 261-4 is performed on data, to which an error detection code is added and on which the t-symbol error correction coding process is performed, for each channel. Then, error detection is performed based on the error detection code, and the t-symbol error correction decoding process by the t-symbol error correction decoder 264 is performed on data for a channel, from which an error is detected, and data for a channel, from which an error is not detected, is directly output with the s-symbol error correction decoding process as a decoding result. Thus, a circuit scale can be reduced without complicating an encoding and decoding process.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A memory controller that controls a memory unit, comprising:
   an encoding unit that generates an error detection code for data to be written to the memory unit, and generates an error correction code capable of correcting t (t is an integer of 2 or more) symbols with respect to the data and the error detection code;
   a memory interface that includes n (n is an integer of 2 or more) number of channels, writes the data, the error detection code, and the error correction code to the memory unit for each of the channels, and reads out the data, the error detection code, and the error correction code from the memory unit as read data for each of the channels;
   n number of first error correction decoding units that each perform a first error correction decoding process capable of correcting s (s is an integer equal to or greater than 1 and smaller than t) symbols on the read data for each of the channels;
   n number of error detecting units that perform an error detecting process for each of the channels based on data decoded by the first error correction decoding process and an error detection code; and
   a second error correction decoding unit, number of which is smaller than n and which performs a second error correction decoding process capable of correcting t symbols on the read data for the channel from which an error is detected by the error detecting unit.

2. The memory controller according to claim 1, wherein the encoding unit generates the error detection code for each of the channels and generates the error correction code for each of the channels.

3. The memory controller according to claim 1, wherein a code length in the first error correction decoding process and a code length in the second error correction decoding process are same.

4. The memory controller according to claim 1, wherein 1 symbol is 1 bit and the error correction code is a BCH code.

5. The memory controller according to claim 1, wherein the error correction code is a Reed-Solomon code.

6. The memory controller according to claim 1, wherein the encoding unit calculates a generator polynomial based on a value of t, which is a correction capability given from outside, and a predetermined primitive polynomial, and generates the error correction code by using the generator polynomial.

7. The memory controller according to claim 1, wherein the second error correction decoding unit is capable of changing a value of t, which is a correction capability.

8. The memory controller according to claim 1, wherein number of the second error correction decoding unit is 1.

9. The memory controller according to claim 1, wherein number of the second error correction decoding unit is 2 or more.

10. A semiconductor storage device comprising:
    a memory unit; and
    a memory controller that controls writing to the memory unit and reading from the memory unit, wherein
    the memory controller includes
      an encoding unit that generates an error detection code for data to be written to the memory unit, and generates an error correction code capable of correcting t (t is an integer of 2 or more) symbols with respect to the data and the error detection code, a memory interface that includes n (n is an integer of 2 or more) number of channels, writes the data, the error detection code, and the error correction code to the memory unit for each of the channels, and reads out the data, the error detection code, and the error correction code from the memory unit as read data for each of the channels, n number of first error correction decoding units that each perform a first error correction decoding process capable of correcting s (s is an integer equal to or greater than 1 and smaller than t) symbols on the read data for each of the channels, n number of error detecting units that perform an error detecting process for each of the channels based on data decoded by the first error correction decoding process and an error detection code, and a second error correction decoding unit, number of which is smaller than n and which performs a second error correction decoding process capable of correcting t symbols on the read data for the channel from which an error is detected by the error detecting unit.

11. A decoding method of decoding data, an error detection code generated for the data, and an error correction code capable of correcting t (t is an integer of 2 or more) symbols generated with respect to the data and the error detection code, in a semiconductor storage device including n (n is an integer of 2 or more) number of channels, the data, the error detection code, and the error correction code being stored in a memory unit, the method comprising:

reading out the data, the error detection code, and the error correction code from the memory unit as read data for each of the channels;

performing a first error correction decoding process capable of correcting s (s is an integer equal to or greater than 1 and smaller than t) symbols on the read data for each of the channels, by each of n number of first error correction decoding units;

performing an error detecting process for each of the channels by each of n number of error detecting units, based on data decoded by the first error correction decoding process and an error detection code; and performing a second error correction decoding process capable of correcting t symbols on the read data for a channel from which an error is detected in the error detecting step, by a second error correction decoding unit, number of which is smaller than n.

12. The decoding method according to claim 11, wherein the error detection code is generated for each of the channels and the error correction code is generated for each of the channels.

13. The decoding method according to claim 11, wherein a code length in the first error correction decoding process and a code length in the second error correction decoding process are same.

14. The decoding method according to claim 11, wherein 1 symbol is 1 bit and the error correction code is a BCH code.

15. The decoding method according to claim 11, wherein the error correction code is a Reed-Solomon code.

16. The decoding method according to claim 11, wherein a generator polynomial is calculated based on a value of t, which is a correction capability given from outside, and a predetermined primitive polynomial, and the error correction code is generated by using the generator polynomial.

17. The decoding method according to claim 11, wherein the second error correction decoding unit is capable of changing a value of t, which is a correction capability.

18. The decoding method according to claim 11, wherein number of the second error correction decoding unit is 1.

19. The decoding method according to claim 11, wherein number of the second error correction decoding unit is 2 or more.

* * * * *